(12) United States Patent
Zhang et al.

(10) Patent No.: US 7,098,144 B2
(45) Date of Patent: Aug. 29, 2006

(54) IRIDIUM OXIDE NANOTUBES AND METHOD FOR FORMING SAME

(75) Inventors: Fengyan Zhang, Vancouver, WA (US); Robert A. Barrowcliff, Vancouver, WA (US); Gregory M. Stecker, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 107 days.

(21) Appl. No.: 10/971,280

(22) Filed: Oct. 21, 2004

(65) Prior Publication Data
US 2006/0099758 A1   May 11, 2006

(51) Int. Cl.
*H01L 21/302* (2006.01)
(52) U.S. Cl. ............... 438/734; 257/43; 257/E23.025; 977/811; 977/840
(58) Field of Classification Search ............ 438/734; 257/43; 977/840, 811
See application file for complete search history.

(56) References Cited

OTHER PUBLICATIONS

Chen et al, Field emission from vertically aligned conductive IrO2 nanorods, Mar. 1, 2004, Applied Physics Letters, vol. 84, No. 9, pp. 1552-1554.*
Yi Cui and Charles M. Lieber, Science, 291 (2001) 851 (Si nano wire for computing).
Lincoln J. lauhon, mark S. Gudlksen, Deli Wang, and Charles M. Lieber, Nature, 420 (2002) 57 (Ge).
Jianfang Wang, Mark S. Gudiksen, Xiangfang Duan, Yi Cui, Charles M. Lieber, Science. 293 (2001) 1455 (InP).
Zhaohui Zhong, Fang Qian, Deli Wang, and Charles M. Lieber , Nano Letter, 3 (2003) 344 (GaN).
Zhaohui Zhong, Deli Wang, Yi Cui, Marc W. Bockrath, Charles M. Lieber, Science 302 (2003) 1377 (nano computing).
M. Vazquez, K. Pirota, M. Hernandez-Velez, V.M. Prida, D. Navas, R. Sanz, and F. Batallan, J. Appl. Phys. 95 (2004) 6642 (Ni with template).
B. Erdem Alaca, Huseyin Sehitoglu, and Taher Saif, . Appl. Phys. Lett. 84 (2004) 4669 (Ni in crack).
C.A. Decker, R. Solanki, J.L. Freeouf, and J.R. Carruthers, D.R. Evans, Appl. Phys. Lett. 84 (2004) 1389 (NiSi).
T.C. Wong, C.P. Li, R.Q. Zhang, and S.T. Lee, Appl. Phys. Lett. 84 (2004) 407 (Au template with Au nano particles).
Oguzhan Gurlu, Omer A. O. Adam, Harold J. W. Zandvliet, and Bene Poelsema, Appl. Phys. Lett, 83 (2003) 4610 (Pt nano wire).
Q. Wan, C. L. Lin, X.B. Yu, and T.H. Wang, Appl. Phys. Lett. 84 (2004) 124 (ZnO).

(Continued)

*Primary Examiner*—Michelle Estrada
*Assistant Examiner*—Nicholas J. Tobergte
(74) *Attorney, Agent, or Firm*—Law Office of Gerald Maliszewski; Gerald Maliszewski

(57) ABSTRACT

A method is provided for forming iridium oxide (IrOx) nanotubes. The method comprises: providing a substrate; introducing a (methylcyclopentadienyl)(1,5-cyclooctadiene) iridium(I) precursor; introducing oxygen as a precursor reaction gas; establishing a final pressure in the range of 1 to 50 Torr; establishing a substrate, or chamber temperature in the range of 200 to 500 degrees C.; and using a metalorganic chemical vapor deposition (MOCVD) process, growing IrOx hollow nanotubes from the substrate surface. Typically, the (methylcyclopentadienyl)(1,5-cyclooctadiene)iridium(I) precursor is initially heated in an ampule to a first temperature in the range of 60 to 90 degrees C., and the first temperature is maintained in the transport line introducing the precursor. The precursor may be mixed with an inert carrier gas such as Ar, or the oxygen precursor reaction gas may be used as the carrier.

23 Claims, 5 Drawing Sheets

OTHER PUBLICATIONS

Michael H. Huang, Samuel Mao, Henning Feick, Haoquan Yan, Yiying Wu, Hannes Kind, Eicke Weber, Richard Russo, Peidong Yang, Science. 292 (2001) 1897 (ZnO).

F. Maury, F. Senocq, Surface and Coatings Technology, 163-164 (2003) 208.

J. P. Endle, Y.-M. Sun, N. Nguyen, S. Madhukar, R.L. Hance, J.M. White, J.G. Ekerdt, Thin Solid Films, 388 (2001) 126.

Reui-San Chen, Yi-Sin Chen, Ying-Sheng Huang, Yao-Lun Chen, Yun Chi, Chao-Shiuan Liu, Kwong-Kau Tiong, and Arthur J. Carty, Chem. Vap. Deposition, 9(2003), 301.

* cited by examiner

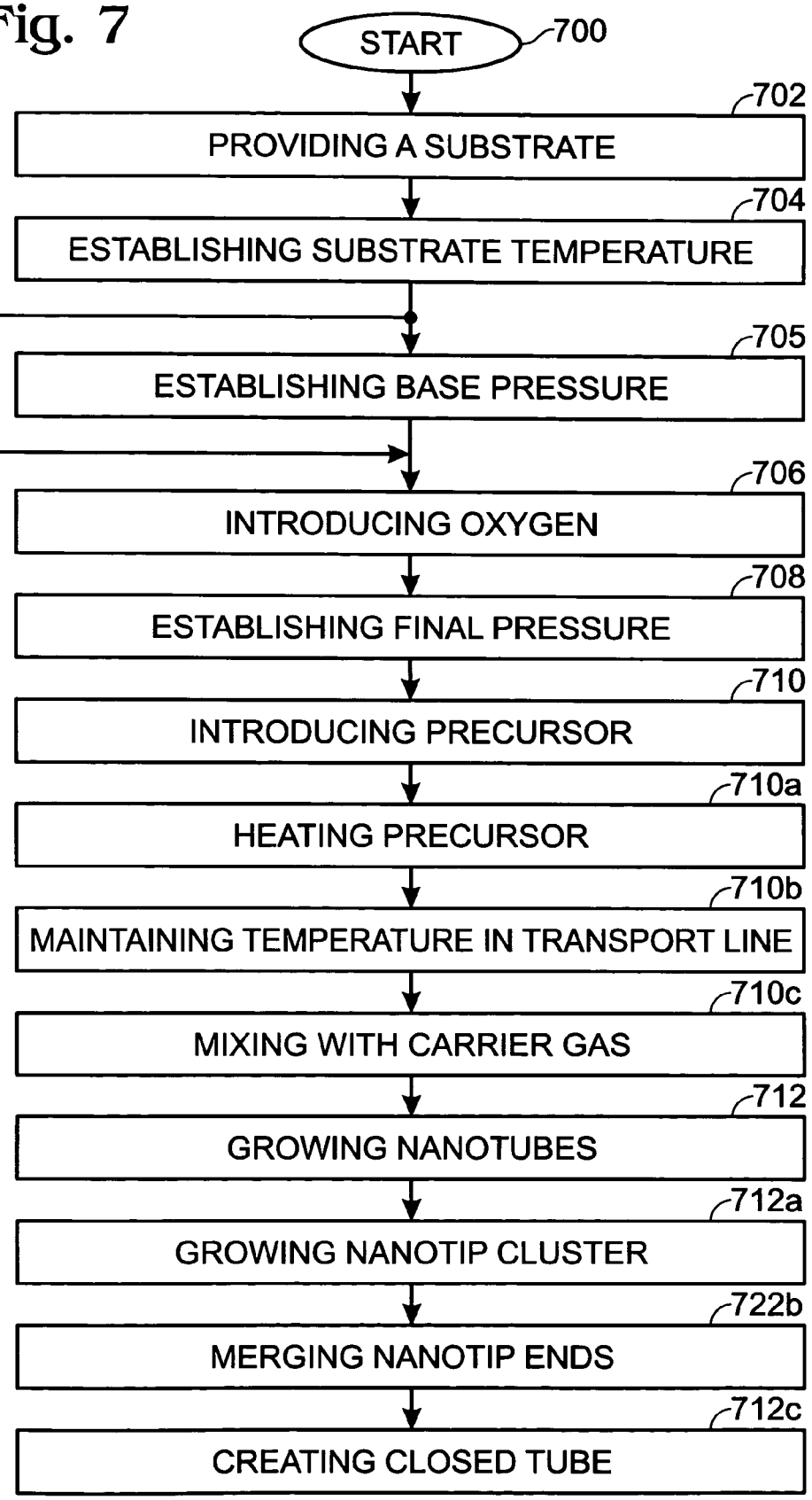

US 7,098,144 B2

IRIDIUM OXIDE NANOTUBES AND METHOD FOR FORMING SAME

BACKGROUND OF THE INVENTION

1. Field of the Invention

This invention generally relates to integrated circuit (IC) fabrication and, more particularly, to a method for forming iridium oxide nanotubes.

2. Description of the Related Art

Recently, the fabrication of nanowires has been explored, due to its potential importance as a building block in nano, microelectromechanical (MEM), and nanoelectromechanical NEM device applications. For example, researchers associated with Charles Lieber have reported the synthesis of a variety of semiconductor nanowires made from materials such as silicon (Si), Si-germanium (SiGe), InP, and GaN, for use in building nano-computing system. Other groups also report using template structures to grow metallic nanowires made of materials such as Ni, NiSi, Au, and Pt. Metallic nanowires can be used for electrical interconnections and the relatively sharps tips of the nanowires make them effective for field emission purposes. $ZnO_2$ nanowires are potentially useful as a light emission element.

However, no processes have been reported that are able to create metallic nanowires without the use of a porous material or template. The templates add a considerable degree of complexity to the process. Thus, a more practical and commercially feasible means of forming metallic nanowires is desirable. It would be especially useful if iridium oxide ($IrO_2$) nanowire could be grown using a metalorganic chemical vapor deposition (MOCVD) methods without a template. $IrO_2$ is a conductive metal oxide that is already widely used in DRAM and FeRAM applications, so its use could be easily integrated into convention IC fabrication. $IrO_2$ can be used as a conductive electrode, as it has stable electrical and chemical properties, even at high temperature $O_2$ ambient conditions. $IrO_2$ can also be used as pH sensor material. Ir thin film can be deposited using PVD easily with excellent polycrystalline structure and strong (111) orientation. $IrO_2$ can be formed afterwards, by oxidizing the Ir film, or it can be formed directly using reactive sputtering method at higher temperatures in oxygen ambient. CVD methods have recently been developed grow Ir and $IrO_2$ thin films. It is relatively easy to maintain good composition control in CVD processes, and the method is know to provide good step coverage.

Reui-San Chen et al. have published a paper that discusses making $IrO_2$ nanorods by MOCVD deposition, using a (methylcyclopentadienyl) (1,5-cyclooctadiene) iridium (I) precursor. They also explored the potential use of $IrO_2$ nanorods in field emission applications. The nanorods they grew were a few microns long, and about 100 nanometers (nm) in diameter. However, successfully repeated experiments obtaining similar vertically aligned $IrO_2$ nanorods show that, although these structures exhibit sharp tips, the crystal structure is amorphous or polycrystalline. The crystalline structure is a result of defects, or a high dislocation density, resulting from the fact that there is insufficient diffusion to overcome the effects of shadowing during growth, which acts to provide more precursor to the nanorod tips than to the nanorod stem, or rod bottom sections.

It would be advantageous if iridium oxide nanorods could be grown in a cluster, to form a hollow nanotube structure, in an MOCVD process.

It would be advantageous if the hollow nanotube could be formed without the use of a template.

SUMMARY OF THE INVENTION

This application describes the clustered growth of IrOx nanotips, into hollow nanotubes, on Ti, TiN, TaN, or SiO2 substrates. The growth length, density, and vertical orientation can be controlled by temperature, pressure, flow, substrate material, and time variables.

Accordingly, a method is provided for forming iridium oxide (IrOx) nanotubes. The method comprises: providing a substrate; introducing a (methylcyclopentadienyl)(1,5-cyclooctadiene)iridium(I) precursor; introducing oxygen as a precursor reaction gas; establishing a final pressure in the range of 1 to 50 Torr; establishing a substrate, or chamber temperature in the range of 200 to 500 degrees C.; and using a metalorganic chemical vapor deposition (MOCVD) process, growing IrOx hollow nanotubes from the substrate surface.

Typically, the (methylcyclopentadienyl)(1,5-cyclooctadiene) iridium(I) precursor is initially heated in an ampule to a first temperature in the range of 60 to 90 degrees C., and the first temperature is maintained in the transport line introducing the precursor. The precursor may be mixed with an inert carrier gas such as Ar, or the oxygen precursor reaction gas may be used as the carrier. However carried, the precursor and carrier gas are introduced at a flow rate in the range of 50 to 500 standard centimeter cube per minute (sccm).

In one aspect, the IrOx hollow nanotubes have square-shaped diameters. The diameters are in the range of 100 Å to 1 micron and nanotube lengths are in the range of 500 Å to 2 microns. Thus, the nanotubes have an aspect ratio (length to width) in the range of 1:1 to 50:1. The square-shaped hollow form of the nanotubes comes about as a result of: growing a cluster of adjacent nanorods with tips; merging the nanorod tips, typically four tips; and growing the cluster of merged tips, creating a closed tube structure.

Additional details of the above-described method and an IrOx nanotube device are described below.

BRIEF DESCRIPTION OF THE DRAWINGS

FIG. 7 is a flowchart illustrating a method for forming iridium oxide (IrOx) nanotubes.

DETAILED DESCRIPTION

Figure 1:
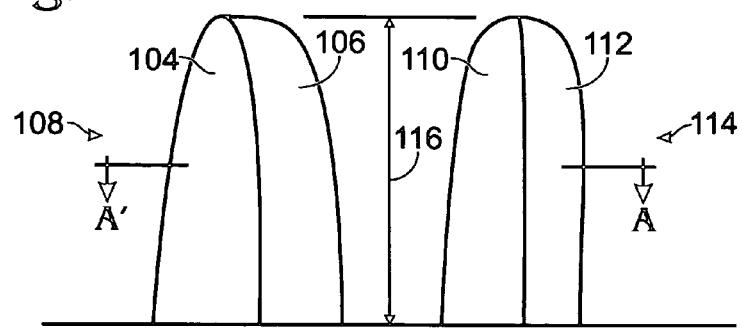
FIG. 1 is a partial cross-sectional side view of an iridium oxide (IrOx) nanotube.

FIG. 1 is a partial cross-sectional side view of an iridium oxide (IrOx) nanotube. The value of "x" may be 2, in which case the Ir is completely oxidized, to values approaching zero, in which case the Ir is incompletely oxidized. The nanotube comprises a plurality of clustered IrOx nanotips with joined ends 102. Shown are nanotips 104 and 106, forming part of nanotube 108. Nanotips 110 and 112 form part of nanotube 114. The nanotip ends are joined to form an IrOx hollow nanotube (see FIG. 2). The nanotubes 108 and 104 may have a length 116 that varies in the range of 500 Å to 2 microns. In one aspect, the nanotubes has a polycrystalline structure and a (101) orientation. Note, the length of adjacent nanotubes need not necessarily be uniform. Rather, the lengths of adjacent nanotubes may vary.

Figure 2:
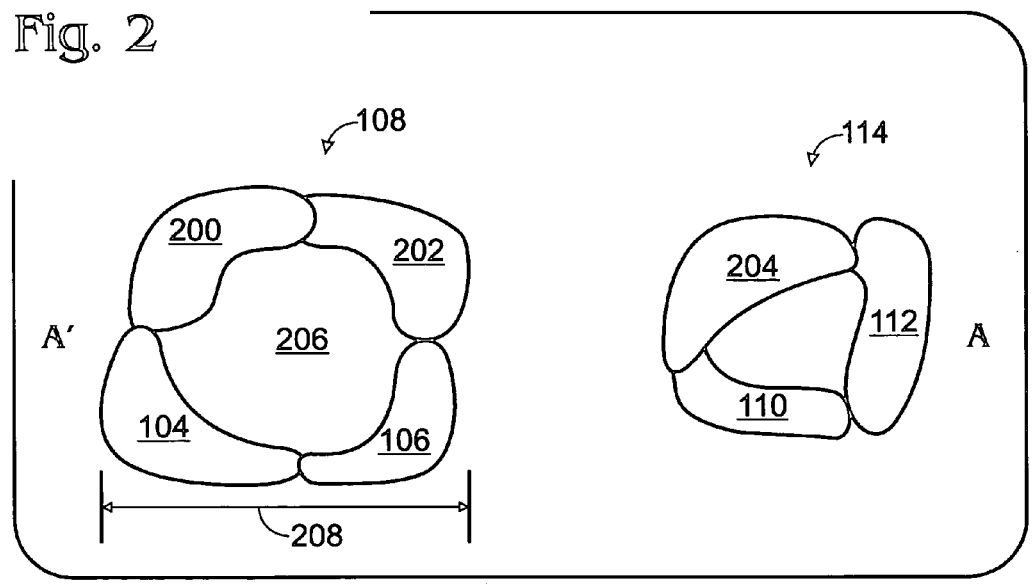
FIG. 2 is a partial cross-sectional plan view of the nanotubes of FIG. 1.

FIG. 2 is a partial cross-sectional plan view of the nanotubes of FIG. 1. In this view, it can be seen that nanotube 108 is additionally formed from nanotips 200 and 202. Nanotube 114 is formed from additional nanotube 204. Typically, the nanotube is made up of four nanotips, to give the nanotube its hollow characteristic, as well as a square-shaped diameter. Nanotube 108 is shown with a cavity 206, formed between the nanotips, and a diameter 208. As shown the cavity 206 also has a square shape. Note, although only 3-nanotip and 4-nanotip nanotubes are shown, the nanotube is not necessarily limited to any particular number of nanotips. The selection of the number of nanotips per nanotube helps define the nanotube diameter 208 and cavity 206 size. In some aspects, the hollow nanotube 108 has a diameter 208 in the range of 100 Å to 1 micron. Considering both FIGS. 1 and 2, the hollow nanotube 108 or 114 has an aspect ratio (length to width) in the range of 1:1 to 50:1. The diameters, and the number of nanotips per nanotube of adjacent nanotubes need not be uniform, but may vary.

Functional Description

IrOx nanotubes have been successfully grown on TiN, TaN, Ti, Ta, and SiO2 substrates. (methylcyclopentadienyl)(1,5-cyclooctadiene)iridium(I) is used as precursor. Both the precursor and the transport line are maintained at a constant temperature of 60–90° C. High purity oxygen at flow rate of 50–500 sccm can be used as carrier gas through an ampule of the Ir precursor. An additional pure oxygen line can be added to dilute the concentration of the precursor, or to increase the total flow rate of the precursor. A higher initial chamber pressure may also be used to enhance the nanotubes nucleation. Generally, a base pressure is initially established to make the growth chamber as clean as possible. Then, the chamber is filled with, either oxygen only, or oxygen plus precursor to bring the pressure to the 1–50 torr range. The growth temperature in the chamber is from 200–500° C., and the pressure of the chamber is held at 1–50 torr during growth.

Figure 3A:
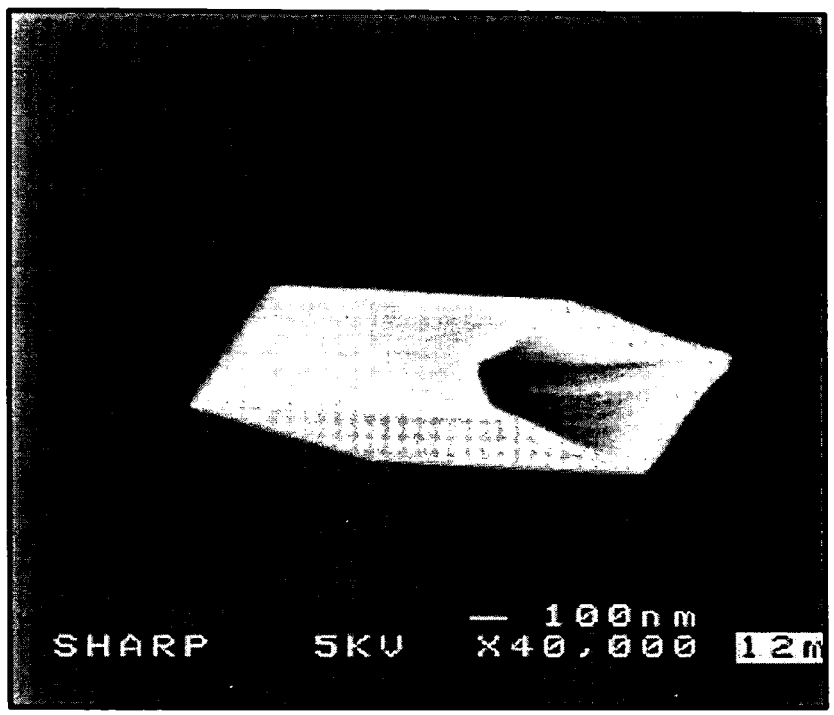
FIGS. 3A and 3B are photographs showing the square shape of IrOx nanotubes formed on SiO2 substrates.
Figure 3B:
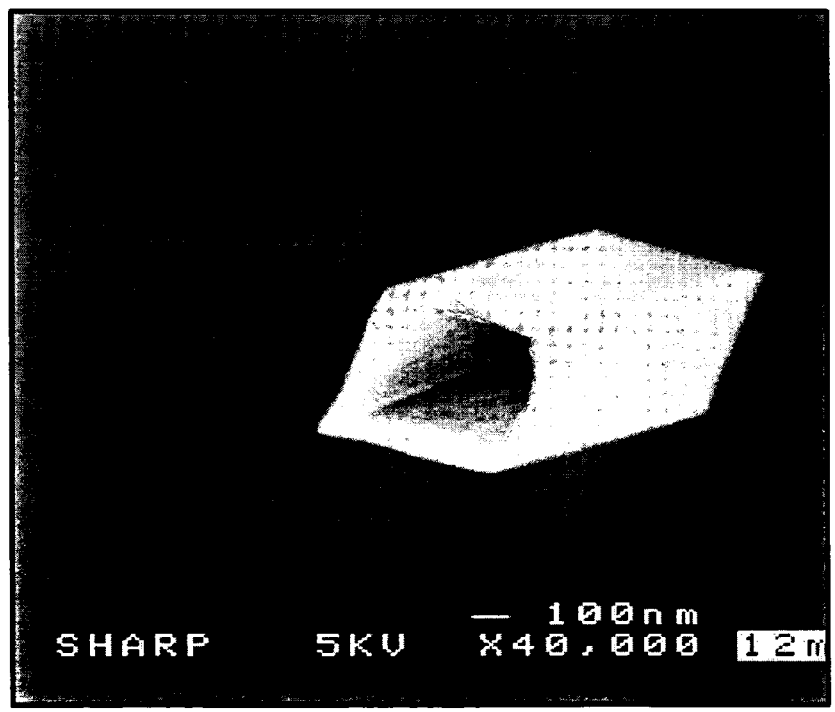

FIGS. 3A and 3B are photographs showing the square shape of IrOx nanotubes formed on SiO2 substrates.

Figure 4A:
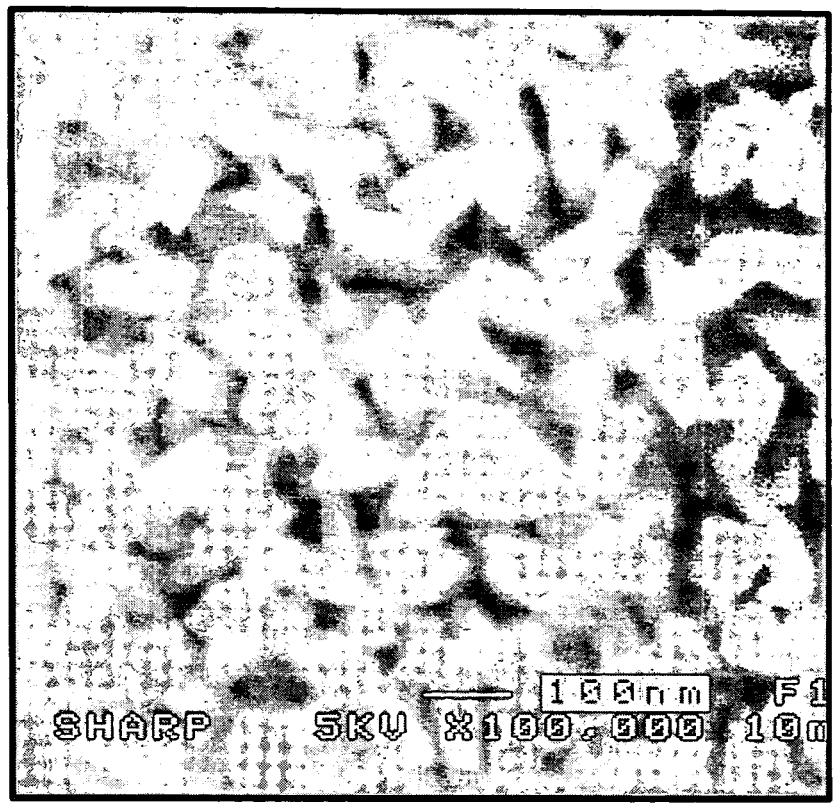
FIGS. 4A and 4B are photographs showing IrOx nanotubes grown on a TaN substrate.
Figure 4B:

FIGS. 4A and 4B are photographs showing IrOx nanotubes grown on a TaN substrate. The thickness of TaN layer is about 10 nm. It is interesting to note that by selecting the growth temperature, pressure, and the supply of the precursor, the IrOx nanotips clustering function can be controlled. As noted above, four nanotips can be clustered together to form a closed tube growth.

Figure 5:
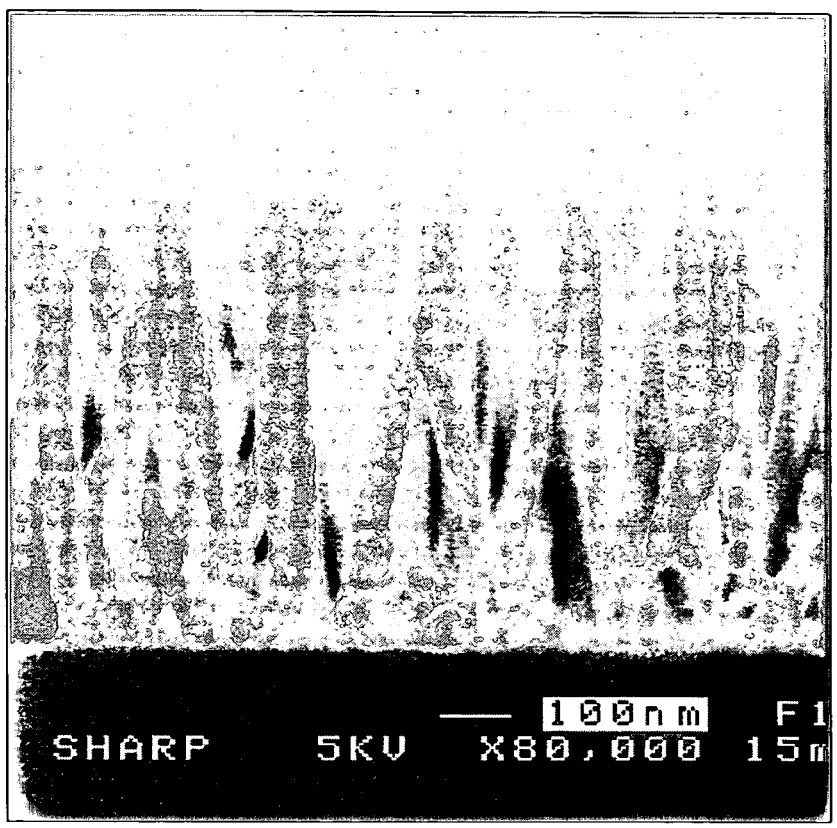
FIG. 5 is a photograph depicting individual nanotips, prior to clustering.

FIG. 5 is a photograph depicting individual nanotips, prior to clustering.

Figure 6:
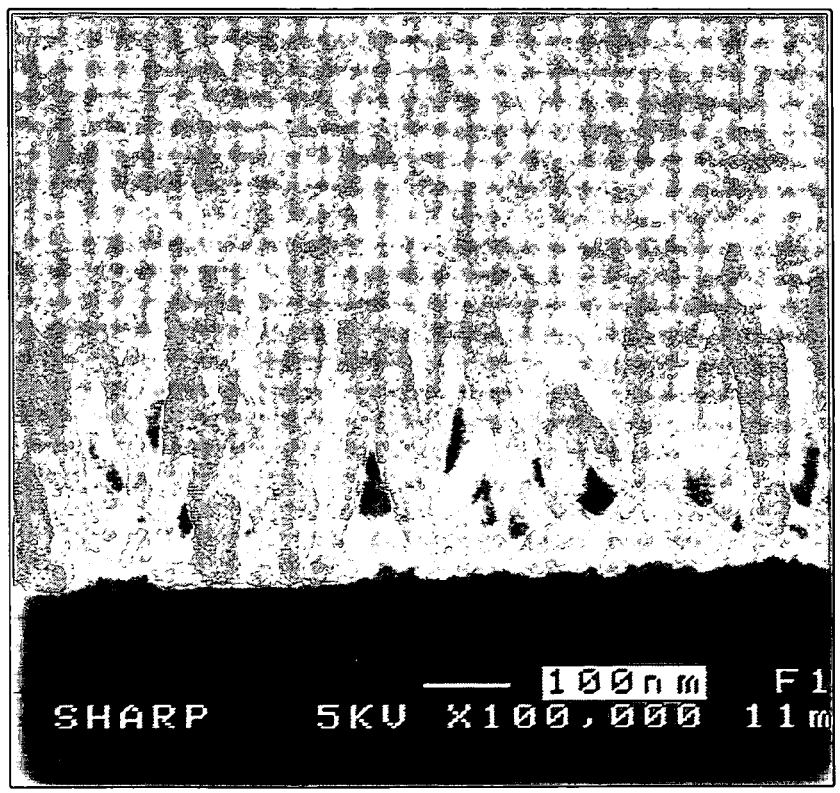
FIG. 6 is a photograph depicting nanotips as they begin the process of clustering into a nanotube.

FIG. 6 is a photograph depicting nanotips as they begin the process of clustering into a nanotube.

FIG. 7 is a flowchart illustrating a method for forming iridium oxide (IrOx) nanotubes. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 provides a substrate with a surface, made from a material such as TiN, TaN, Ti, Ta, Si, or SiO2. However, it should be noted that the method is not necessarily limited to this list of substrate materials. Step 704 establishes a substrate, or chamber temperature in the range of 200 to 500 degrees C. Step 706 introduces oxygen as a precursor reaction gas. Step 708 establishes a final pressure in the range of 1 to 50 Torr. In one aspect, the final pressure is in the range of 30 to 50 Torr. Step 710 introduces a (methylcyclopentadienyl)(1,5-cyclooctadiene) iridium(I) precursor. Step 712, using a metalorganic chemical vapor deposition (MOCVD) process, grows IrOx hollow nanotubes from the substrate surface.

In one aspect, Step 705, prior to introducing the precursor (Step 710), establishes a base pressure in the range of $1\times10^{-8}$ to $1\times10^{-3}$ Torr. In one variation, the final pressure is established as follows. Step 706 adds oxygen, increasing the base pressure to the final pressure. After the final pressure has been reached in Step 708, the precursor is introduced in Step 710. That is, Step 710 follows Step 708. Alternately, the final pressure is established in Step 708 as a result of simultaneously adding oxygen and precursor, increasing the base pressure to the final pressure. Thus, Step 708 occurs as a result of simultaneously performing Steps 706 and 710.

In one aspect, introducing the (methylcyclopentadienyl)(1,5-cyclooctadiene)iridium(I) precursor in Step 710 includes substeps. Step 710a initially heats the precursor to a first temperature in the range of 60 to 90 degrees C. Step 710b maintains the first temperature in the transport line introducing the precursor. Step 710c mixes the precursor with a carrier gas. For example, the carrier gas can be Ar or oxygen.

If the carrier gas is oxygen, then Steps 706 and 710 may be combined. However, even if oxygen is used as a carrier, additional oxygen may be introduced in a line separate from the precursor. If oxygen is not the carrier, it is introduced through the separate line (step 706 is independent of Step 710). However introduced, the overall oxygen flow rate is typically in the range of 50 to 500 sccm. Likewise, the precursor and carrier (Step 710) are introduced at a flow rate in the range of 50 to 500 sccm.

In another aspect, growing IrOx hollow nanotubes from the substrate surface in Step 712 includes growing nanotubes with square-shaped diameters. In a different aspect, Step 712 grows nanotubes with a diameter in the range of 100 Å to 1 micron. In one aspect, Step 712 grows nanotubes having a length in the range of 500 Å to 2 microns. Thus, the nanotubes may have an aspect ratio (length to width) in the range of 1:1 to 50:1.

In another aspect, growing IrOx hollow nanotubes in Step 712 includes substeps. Step 712a grows a cluster of adjacent nanotips with ends. Step 712b merges the nanotip ends. Step 712c grows the cluster of merged ends, creating a closed tube structure. In one aspect, Step 712b merges four ends from the cluster.

A method for making IrOx nanotubes, and a hollow IrOx nanotube structure have been provided. A few materials and process particulars have been presented to explain the invention. However, the invention is not limited to just these examples. Although examples of devices have not been provided, it should be appreciated that the invention has applicability to RAM, FeRAM, field electrode, pH sensor, and nano computer applications. Other variations and embodiments of the invention will occur to those skilled in the art.

We claim:

1. A method for forming iridium oxide (IrOx) nanotubes, the method comprising:

providing a substrate with a surface;

introducing a (methylcyclopentadienyl)(1,5-cyclooctadiene)iridium(I) precursor as follows:
  initially heating the precursor to a first temperature in the range of 60 to 90 degrees C.;
  maintaining the first temperature in the transport line introducing the precursor; and
  mixing the precursor with a carrier gas;
introducing oxygen as a precursor reaction gas; and,
using a metalorganic chemical vapor deposition (MOCVD) process, growing IrOx hollow nanotubes from the substrate surface.

2. The method of claim 1 further comprising:
establishing a final pressure in the range of 1 to 50 Torr.

3. The method of claim 2 further comprising:
prior to introducing the precursor, establishing a base pressure in the range of $1\times10^{-8}$ to $1\times10^{-3}$ Torr.

4. The method of claim 3 wherein introducing oxygen as a precursor reaction gas includes adding oxygen to increase the base pressure to the final pressure; and,
wherein introducing precursor includes introducing precursor after the final pressure has been reached.

5. The method of claim 3 wherein establishing a final pressure includes simultaneously adding oxygen and precursor, increasing the base pressure to the final pressure.

6. The method of claim 1 wherein mixing the precursor with a carrier gas includes mixing with a carrier gas selected from the group including Ar and oxygen.

7. The method of claim 1 wherein introducing the (methylcyclopentadienyl) (1,5-cyclooctadiene)iridium(I) precursor includes introducing the precursor and carrier gas at a flow rate in the range of 50 to 500 standard centimeter cube per minute (sccm).

8. The method of claim 1 wherein introducing oxygen as a precursor reaction gas includes introducing oxygen at a flow rate in the range of 50 to 500 sccm.

9. The method of claim 2 wherein establishing a final pressure in the range of 1 to 50 Torr includes establishing a final pressure in the range of 30 to 50 Torr.

10. The method of claim 1 further comprising:
establishing a substrate temperature in the range of 200 to 500 degrees C.

11. The method of claim 1 wherein growing IrOx hollow nanotubes from the substrate surface includes growing nanotubes with square-shaped diameters.

12. The method of claim 1 wherein growing IrOx hollow nanotubes from the substrate surface includes growing nanotubes with a diameter in the range of 100 Å to 1 micron.

13. The method of claim 1 wherein growing IrOx hollow nanotubes from the substrate surface includes growing nanotubes having an aspect ratio (length to width) in the range of 1:1 to 50:1.

14. The method of claim 1 wherein growing IrOx hollow nanotubes from the substrate surface includes:
growing a cluster of adjacent nanotips with ends;
merging the nanotip ends; and
growing the cluster of merged ends, creating a closed tube structure.

15. The method of claim 14 wherein merging the nanotip ends includes merging four ends from the cluster.

16. The method of claim 1 wherein providing a substrate with a surface includes providing a substrate made from a material selected from the group including TiN, TaN, Ti, Ta, Si, and SiO2.

17. The method of claim 1 wherein growing IrOx hollow nanotubes from the substrate surface includes growing nanotubes having a length in the range of 500 Å to 2 microns.

18. An iridium oxide (IrOx) nanotube, the nanotube comprising:
a plurality of clustered IrOx nanotips with joined ends;
a hollow cavity formed between the nanotips; and
wherein a IrOx hollow nanotube is formed by joining 4 nanotip ends.

19. The nanotubes of claim 18 wherein the hollow nanotube has a square-shaped diameter.

20. The nanotube of claim 18 wherein the hollow nanotube has a diameter in the range of 100 Å to 1 micron.

21. The nanotube of claim 18 wherein the hollow nanotube has an aspect ratio (length to width) in the range of 1:1 to 50:1.

22. The nanotube of claim 18 wherein the nanotubes have a length in the range of 500 Å to 2 microns.

23. A method for forming iridium oxide (IrOx) nanotubes, the method comprising:
providing a substrate with a surface;
introducing a (methylcyclopentadienyl) (1,5-cyclooctadiene)iridium(I) precursor; and
using a metalorganic chemical vapor deposition (MOCVD) process, growing IrOx hollow nanotubes from the substrate surface as follows:
  growing a cluster of adjacent nanotips with ends;
  merging the nanotip ends; and
  growing the duster of merged ends, creating a closed tube structure.

* * * * *